United States Patent
George et al.

(10) Patent No.: US 9,064,686 B2
(45) Date of Patent: Jun. 23, 2015

(54) METHOD AND APPARATUS FOR TEMPORARY BONDING OF ULTRA THIN WAFERS

(71) Applicants: Gregory George, Colchester, VT (US); Stefan Lutter, Eisingen (DE)

(72) Inventors: Gregory George, Colchester, VT (US); Stefan Lutter, Eisingen (DE)

(73) Assignee: SUSS MICROTEC LITHOGRAPHY, GmbH, Garching (DE)

( * ) Notice: Subject to any disclaimer, the term of this patent is extended or adjusted under 35 U.S.C. 154(b) by 196 days.

(21) Appl. No.: 13/790,684

(22) Filed: Mar. 8, 2013

(65) Prior Publication Data

US 2013/0244400 A1 Sep. 19, 2013

Related U.S. Application Data

(60) Provisional application No. 61/611,627, filed on Mar. 16, 2012.

(51) Int. Cl.
| | |
|---|---|
| *H01L 21/00* | (2006.01) |
| *H01L 21/02* | (2006.01) |
| *H01L 21/20* | (2006.01) |
| *H01L 21/67* | (2006.01) |
| *H01L 21/683* | (2006.01) |

(52) U.S. Cl.
CPC ........ *H01L 21/0201* (2013.01); *H01L 21/2007* (2013.01); *H01L 21/67092* (2013.01); *H01L 21/6835* (2013.01); *H01L 21/6836* (2013.01); H01L 2221/68318 (2013.01); H01L 2221/68327 (2013.01); H01L 2221/6834 (2013.01); H01L 2221/68381 (2013.01)

(58) Field of Classification Search
None
See application file for complete search history.

(56) References Cited

U.S. PATENT DOCUMENTS

| | | |
|---|---|---|
| 6,777,313 B2 | 8/2004 | Takyu et al. |
| 6,792,991 B2 | 9/2004 | Thallner |
| 7,098,152 B2 | 8/2006 | Moore |
| 7,232,740 B1 | 6/2007 | Mountain |
| 7,367,773 B2 | 5/2008 | Buitron et al. |
| 2003/0170424 A1 | 9/2003 | Roberds et al. |
| 2005/0221598 A1 | 10/2005 | Lu et al. |
| 2006/0264004 A1 | 11/2006 | Tong et al. |
| 2006/0289992 A1 | 12/2006 | Wood |
| 2007/0077728 A1 | 4/2007 | Kulkarni et al. |
| 2008/0008565 A1 | 1/2008 | Thallner |

(Continued)

OTHER PUBLICATIONS

International Preliminary Report on Patentability, Sep. 25, 2014.

(Continued)

*Primary Examiner* — Angel Roman
(74) *Attorney, Agent, or Firm* — AKC Patents LLC; Aliki K. Collins (57) ABSTRACT

A method for temporary bonding first and second wafers includes, applying a first adhesive layer upon a first surface of a first wafer and then curing the first adhesive layer. Next, applying a second adhesive layer upon a first surface of a second wafer. Next, inserting the first wafer into a bonder module and holding the first wafer by an upper chuck assembly so that its first surface with the cured first adhesive layer faces down. Next, inserting the second wafer into the bonder module and placing the second wafer upon a lower chuck assembly so that the second adhesive layer faces up and is opposite to the first adhesive layer. Next, moving the lower chuck assembly upwards and bringing the second adhesive layer in contact with the cured first adhesive layer, and then curing the second adhesive layer.

15 Claims, 8 Drawing Sheets

(56) References Cited

U.S. PATENT DOCUMENTS

| | | |
|---|---|---|
| 2008/0200011 A1 | 8/2008 | Pillalamarri et al. |
| 2008/0271845 A1 | 11/2008 | Keite-Telgenbuscher et al. |
| 2008/0302481 A1 | 12/2008 | Berger et al. |
| 2009/0038750 A1 | 2/2009 | Hong et al. |
| 2009/0165277 A1 | 7/2009 | Zussy et al. |
| 2009/0218560 A1 | 9/2009 | Flaim et al. |
| 2009/0258583 A1 | 10/2009 | Thallner |
| 2011/0014774 A1* | 1/2011 | Johnson et al. ............... 438/455 |
| 2012/0034437 A1 | 2/2012 | Puligadda et al. |
| 2014/0210075 A1 | 7/2014 | Lee et al. |
| 2014/0213039 A1 | 7/2014 | Lee et al. |

OTHER PUBLICATIONS

International Search Report, Aug. 13, 2013.

* cited by examiner

METHOD AND APPARATUS FOR TEMPORARY BONDING OF ULTRA THIN WAFERS

CROSS REFERENCE TO RELATED CO-PENDING APPLICATIONS

This application claims the benefit of U.S. provisional application Ser. No. 61/611,627 filed Mar. 16, 2012 and entitled "METHOD AND APPARATUS FOR TEMPORARY BONDING OF ULTRA THIN WAFERS", the contents of which are expressly incorporated herein by reference.

This application is a continuation in part of U.S. application Ser. No. 12/760,973 filed on Apr. 15, 2010 and entitled "APPARATUS FOR THERMAL-SLIDE DEBONDING TEMPORARY BONDED SEMICONDUCTOR WAFERS", which is commonly assigned and the contents of which are expressly incorporated herein by reference.

FIELD OF THE INVENTION

The present invention relates to a method and an apparatus for temporary bonding of ultra thin wafers, and more particularly to temporary wafer bonding that includes a dual coating and dual curing process.

BACKGROUND OF THE INVENTION

Several semiconductor wafer processes include wafer thinning steps. In some applications the wafers are thinned down to a thickness of less than 100 micrometers for the fabrication of integrated circuit (IC) devices. Thin wafers have the advantages of improved heat removal and better electrical operation of the fabricated IC devices. In one example, GaAs wafers are thinned down to 25 micrometers to fabricate power complementary metal oxide semiconductor (CMOS) devices with improved heat removal. Wafer thinning also contributes to a reduction of the device capacitance and to an increase of its impedance, both of which result in an overall size reduction of the fabricated device. In other applications, wafer thinning is used for 3D-Integration bonding and for fabricating through wafer vias.

Wafer thinning is usually performed via back-grinding and/or chemical mechanical polishing (CMP). CMP involves bringing the wafer surface into contact with a hard and flat rotating horizontal platter in the presence of liquid slurry. The slurry usually contains abrasive powders, such as diamond or silicon carbide, along with chemical etchants such as ammonia, fluoride, or combinations thereof. The abrasives cause substrate thinning, while the etchants polish the substrate surface at the submicron level. The wafer is maintained in contact with the abrasives until a certain amount of substrate has been removed in order to achieve a targeted thickness.

For wafer thicknesses of over 200 micrometers, the wafer is usually held in place with a fixture that utilizes a vacuum chuck or some other means of mechanical attachment. However, for wafer thicknesses of less than 200 micrometer and especially for wafers of less than 100 micrometers, it becomes increasingly difficult to mechanically hold the wafers and to maintain control of the planarity and integrity of the wafers during thinning. In these cases, it is actually common for wafers to develop microfractures and to break during CMP.

An alternative to mechanical holding of the wafers during thinning involves attaching a first surface of the device wafer (i.e., wafer processed into a device) onto a carrier wafer and then thinning down the exposed opposite device wafer surface. The bond between the carrier wafer and the device wafer is temporary and is removed upon completion of the thinning and any other processing steps.

Several temporary bonding techniques have been suggested including using of adhesive compounds that are thermally cured. In these adhesive based temporary bonding techniques a wet thick adhesive layer is applied onto the device wafer surface so that it covers all the structures of the device wafer surface including solder bumps, connectors, and integrated circuit (IC) devices. The wet adhesive layer has a typical thickness in the range of in the range of 25 to 150 micrometers. The wet adhesive layer is then brought into contact with the carrier wafer surface and the adhesive is then cured thereby resulting in bonding the device wafer to the carrier wafer. As was mentioned the bond is temporary and can be removed by dissolving the adhesive layer after processing by using chemicals, heat or radiation.

One of the problems with this process is that the thick adhesive layer causes high total thickness variations (TTV) in the wafer surface planarity. A primary TTV influence comes from the post-join thermal curing process. In particular, the thickness of the post-join adhesive layer directly correlates to the TTV error magnitude. Furthermore, a thick wet adhesive layer increases the risk of "squeezing-out" of the adhesive from the sides during the wafer joining step in the uncured state. Accordingly, it is desirable to reduce the thickness of the adhesive layer that is used for temporary bonding of thinned wafers.

SUMMARY OF THE INVENTION

The present invention relates to a method and an apparatus for temporary bonding and fabrication of ultra thin wafers, and more particularly to temporary wafer bonding that includes a dual coating and dual curing process.

In general, in one aspect, the invention features a method for temporary bonding two wafer surfaces including the following. First providing a first wafer comprising first and second wafer surfaces opposite to each other. Next, providing a second wafer comprising first and second wafer surfaces opposite to each other. Next, applying a first adhesive layer upon the first surface of the first wafer. Next, curing the first adhesive layer, thereby producing a cured first adhesive layer. Next, applying a second adhesive layer upon the first surface of the second wafer. Next, providing a bonder module comprising an upper chuck assembly and a lower chuck assembly arranged below and opposite the upper chuck assembly. Next, inserting the first wafer into the bonder module and holding the first wafer by the upper chuck assembly so that its first surface with the cured first adhesive layer faces down. Next, inserting the second wafer into the bonder module and placing the second wafer upon the lower chuck assembly so that the second adhesive layer faces up and is opposite to the first adhesive layer. Next, moving the lower chuck assembly upwards and bringing the second adhesive layer in contact with the cured first adhesive layer, and then curing the second adhesive layer, thereby forming a temporary bond between the first and second wafers.

Implementations of this aspect of the invention may include one or more of the following features. The second adhesive layer is cured by bringing a hot plate in contact with the second surface of the second wafer. The first adhesive layer is applied upon the first surface of the first wafer via spin coating. The first adhesive layer comprises a silicone elastomer. The curing of the first and second adhesive layers occurs at a curing temperature in the range of 80° C. to 160° C. and a curing time in the range of 1-15 minutes. The upper and lower chuck assemblies comprise low force upper and lower chucks, respectively, and the second adhesive layer is brought in contact with the cured first adhesive layer by first evacuating the bonder module and then bringing the bonder module to atmospheric pressure via purging. The method further includes curing the temporary bonded first and second wafers. The curing of the temporary bonded first and second wafers occurs at a curing temperature in the range of 120° C. to 220° C. and a curing time in the range of 1 to 15 minutes. The method further includes thinning the second surface of the first wafer and then debonding the thinned first wafer from the second wafer.

In general, in another aspect, the invention features an apparatus for temporary bonding two wafer surfaces including a first coating chamber, a second coating chamber, a curing chamber and a bonder module. The first coating chamber is configured to apply a first adhesive layer upon a first surface of a first wafer. The second coating chamber is configured to apply a second adhesive layer upon a first surface of a second wafer. The curing chamber is configured to cure the first adhesive layer of the first wafer. The bonder module includes an upper chuck assembly and a lower chuck assembly arranged below and opposite the upper chuck assembly. The upper chuck assembly is configured to hold the first wafer so that its first surface with the cured first adhesive layer faces down. The lower chuck assembly is configured to hold the second wafer so that the second adhesive layer faces up and is opposite to the cured first adhesive layer. The lower chuck assembly is configured to move upwards and thereby to bring the second adhesive layer in contact with the cured first adhesive layer. The curing chamber is further configured to cure the second adhesive layer by bringing a hot plate in contact with a second surface of the second wafer, thereby forming a temporary bond between the first and second wafers. The upper and lower chuck assemblies comprise low force upper and lower chucks, respectively, and the second adhesive layer is brought in contact with the cured first adhesive layer by first evacuating the bonder module and then bringing the bonder module to atmospheric pressure via purging.

In general, in another aspect, the invention features a method for temporary bonding two wafer surfaces including the following. Providing a first wafer comprising first and second wafer surfaces opposite to each other. Providing a second wafer comprising first and second wafer surfaces opposite to each other. Applying a first adhesive layer upon the first surface of the first wafer. Next, curing the first adhesive layer, thereby producing a cured first adhesive layer. Next, applying a second adhesive layer upon the cured first adhesive layer. Providing a bonder module comprising an upper chuck assembly and a lower chuck assembly arranged below and opposite the upper chuck assembly. Inserting the first wafer into the bonder module and holding the first wafer by the upper chuck assembly so that its first surface with the cured first adhesive layer and the second adhesive layer faces down. Next, inserting the second wafer into the bonder module and placing the second wafer upon the lower chuck assembly so that the first surface of the second wafer faces up and is opposite to the second adhesive layer. Next, moving the lower chuck assembly upwards and bringing the first surface of the second wafer in contact with the second adhesive layer, and then curing the second adhesive layer, thereby forming a temporary bond between the first and second wafers.

In general, in another aspect, the invention features an apparatus for temporary bonding two wafer surfaces including a first coating chamber, a curing chamber, a second coating chamber and a bonder module. The first coating chamber is configured to apply a first adhesive layer upon a first surface of a first wafer. The curing chamber is configured to cure the first adhesive layer of the first wafer, thereby producing a first cured adhesive layer. The second coating chamber is configured to apply a second adhesive layer upon the first cured adhesive layer. The bonder module comprises an upper chuck assembly and a lower chuck assembly arranged below and opposite the upper chuck assembly. The upper chuck assembly is configured to hold the first wafer so that its first surface with the cured first adhesive layer and the second adhesive layer faces down. The lower chuck assembly is configured to hold a second wafer so that a first surface of the second wafer faces up and is opposite to the second adhesive layer. The lower chuck assembly is configured to move upwards and thereby to bring the first surface of the second wafer in contact with the second adhesive layer. The curing chamber is further configured to cure the second adhesive layer, thereby forming a temporary bond between the first and second wafers.

In general in another aspect, the invention features a method for temporary bonding two wafer surfaces including the following. Providing a first wafer comprising first and second wafer surfaces opposite to each other. Providing a second wafer comprising first and second wafer surfaces opposite to each other. Applying a first adhesive layer upon the first surface of the first wafer. Next, curing the first adhesive layer, thereby producing a cured first adhesive layer. Next, applying a second adhesive layer upon the first surface of the second wafer. Providing a bonder module comprising an upper chuck assembly and a lower chuck assembly arranged below and opposite the upper chuck assembly. Next, inserting the first wafer into the bonder module and placing the first wafer upon the lower chuck assembly so that its first surface with the cured first adhesive layer faces up. Next, inserting the second wafer into the bonder module and holding the second wafer by the upper chuck assembly so that the second adhesive layer faces down and is opposite to the first adhesive layer. Next, moving the lower chuck assembly upwards and bringing the first adhesive layer in contact with the second adhesive layer. Finally, curing the second adhesive layer, thereby forming a temporary bond between the first and second wafers.

In general in another aspect, the invention features a method for temporary bonding two wafer surfaces including the following. Providing a first wafer comprising first and second wafer surfaces opposite to each other. Providing a second wafer comprising first and second wafer surfaces opposite to each other. Applying a first adhesive layer upon the first surface of the first wafer. Next, curing the first adhesive layer, thereby producing a cured first adhesive layer. Next, applying a second adhesive layer upon the first surface of the second wafer. Next, bringing the first adhesive layer in contact with the second adhesive layer. Finally, curing the second adhesive layer, thereby forming a temporary bond between the first and second wafers.

BRIEF DESCRIPTION OF THE DRAWINGS

Referring to the figures, wherein like numerals represent like parts throughout the several views.

DETAILED DESCRIPTION OF THE INVENTION

Figure 1A:
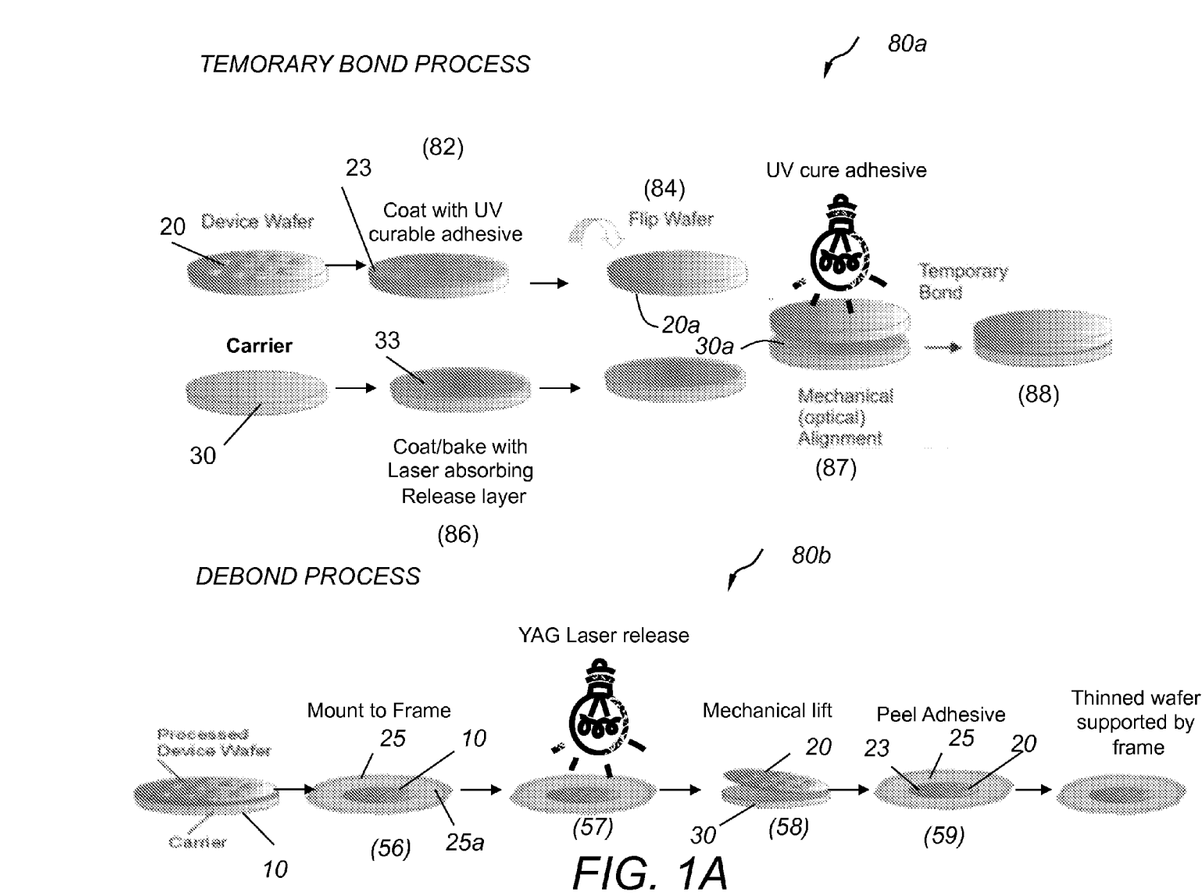
FIG. 1A is a schematic diagram of first example of a temporary wafer bonding process and a debonding process.

Referring to FIG. 1A, temporary bond process 80a includes the following steps. First, a surface of the device wafer 20 is coated with an adhesive layer 23 (82). In one example, adhesive layer 23 is a UV curable adhesive LC3200™, manufactured by 3M Company, MN, USA. The adhesive coated device wafer is then flipped (84). Next, a light absorbing release layer 33 is spin coated on a surface 30a of the carrier wafer 30 (86). In one example, light absorbing release layer 33 is a LC4000, manufactured by 3M Company, MN, USA. Next, the flipped device wafer 20 is aligned with the carrier wafer 30 so that the surface 20a of the device wafer with the adhesive layer 23 is opposite to the surface 30a of the carrier wafer 30 with the light absorbing release layer 33. The two surfaces 20a and 30a are brought into contact and the adhesive layer 23 is cured with UV light (87). The two wafers are bonded (88) in temporary bonder 410, shown in FIG. 2. The bond is a temporary bond between the light absorbing release layer 33 and the adhesive layer 23 and is formed under vacuum of 0.1 mbar and low applied bond force.

Figure 2:
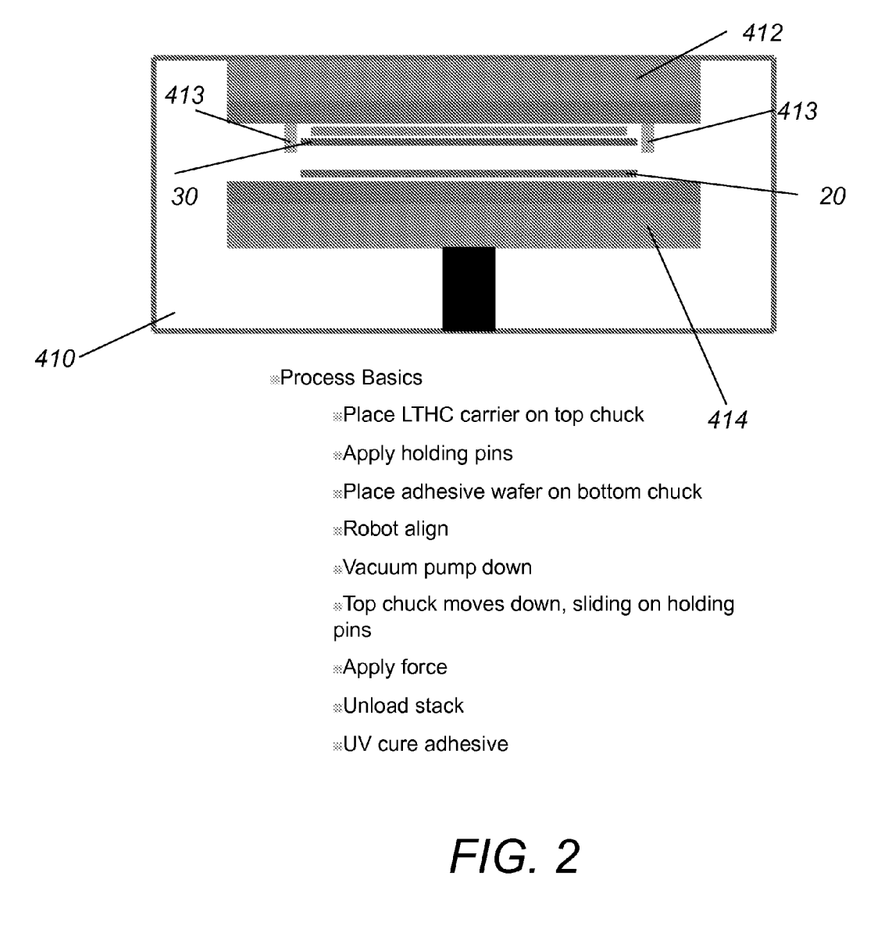
FIG. 2 depicts a schematic cross-sectional view of a bonder and a list of the process steps for performing the temporary wafer bonding process of FIG. 1A and FIG. 1B.

Referring to FIG. 2, the carrier wafer 30 with the laser absorbing release layer LTHC layer 33 is placed on the top chuck 412 and held in place by holding pins 413. Next, the device wafer 20 is placed on the bottom chuck 414 with the adhesive layer 23 facing up. Next, the wafers 20, 30 are aligned, the chamber is evacuated, and the top chuck 412 with the carrier wafer 30 is dropped onto the device wafer 20. A low force is applied for the formation of the bond between the release layer 33 and the adhesive layer 23. Next, the bonded wafer stack 10 is unloaded and the adhesive is cured with UV light. In other embodiments, the carrier wafer 30 is placed on the bottom chuck 414 and the device wafer 20 is placed on the top chuck 412. In other embodiments, the adhesive layer is thermally cured by bringing the wafers in contact with a hot plate or via thermal radiation.

Next, the temporary bonded wafer stack 10 is placed in a CMP chamber and the back surface of the device wafer 20 is thinned via CMP. After the thinning process, the wafer stack 10 is debonded via the debond process 80b.

Figure 3:
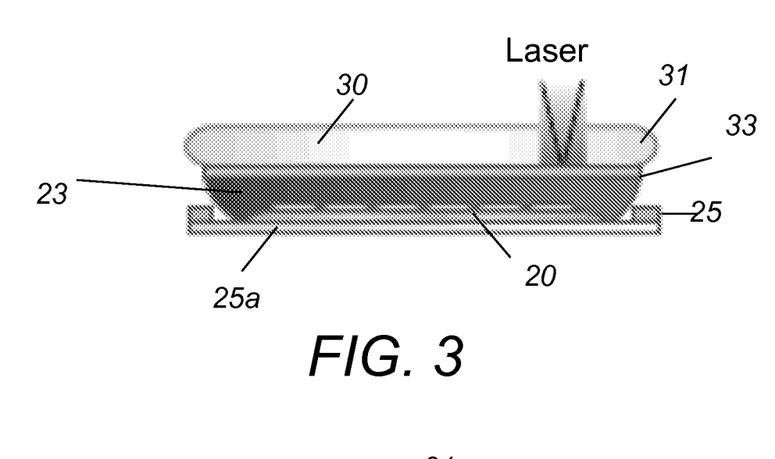
FIG. 3 depicts a schematic cross-sectional side view of the laser debonding step of FIG. 1A.
Figure 4:
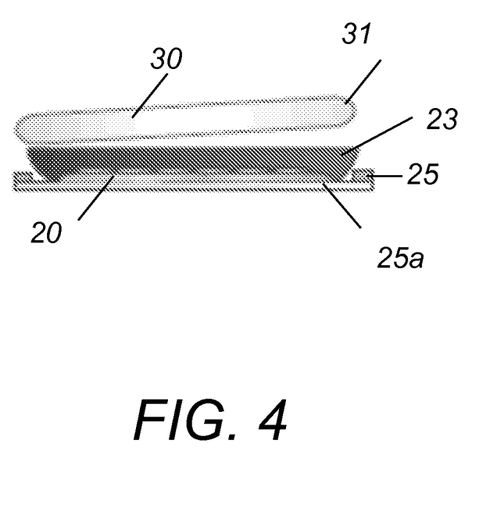
FIG. 4 depicts a schematic cross-sectional side view of the mechanical debonding step of FIG. 1A and FIG. 1B.
Figure 5:
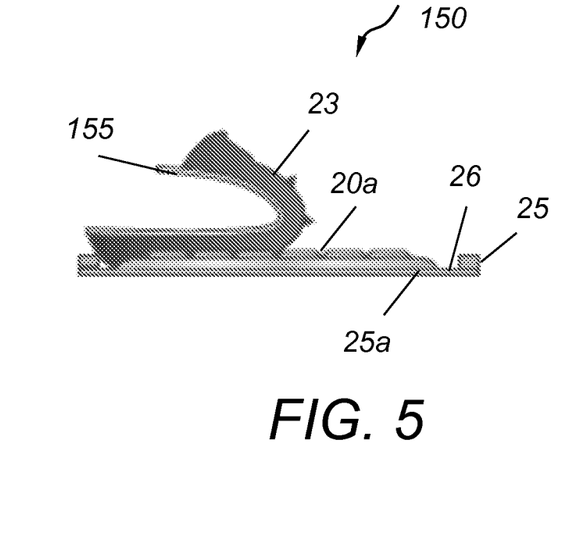
FIG. 5 is a schematic diagram of the detaping process of FIG. 1A and FIG. 1B.

Referring back to FIG. 1A, the debond process 80b includes the following steps. The bonded wafer stack 10 is mounted onto a dicing frame 25 (56) and the carrier wafer 30 is illuminated with a YAG laser beam, as shown in FIG. 3. The laser beam causes the separation of the wafer stack along the release layer 33 (57) and the separated carrier wafer 30 is mechanically lifted away from the device wafer 20 (58) by pushing edge 31 away, as shown in FIG. 4. The laser debonding process is a low stress process that utilizes no chemicals and is carried out at room temperature. The mechanical debonding process utilizes very low force. After separation the carrier is recycled, cleaned and reused again. The mechanical debonding operation is described in co-pending application Ser. No. 12/761,014 entitled "Apparatus for mechanically debonding temporary bonded semiconductor wafers" the contents of which are incorporated herein by reference. The adhesive layer 23 is then peeled away from the device wafer surface 20a (59) and the thinned device wafer 20 remains supported by the dicing frame 25. Referring to FIG. 5, a detaping tape 155 is applied on top of the exposed adhesive layer 23. In one example detaping tape 155 is tape 3305 manufactured by 3M Company. Tape 3305 is a transparent polyester film tape with an aggressive rubber adhesive specifically designed for the removal of silicon backgrinding tape. The detaping tape 155 is pressed onto and attached to the adhesive layer 23 and when the tape 155 is peeled away the adhesive layer 155 is also peeled away from the surface 20a of the device wafer 20. Chemical cleaning may be used to remove any remaining adhesive residue from the device wafer surface 20a. However, the adhesive residue levels on the device wafer 20 after the removal of the adhesive layer 23 with the detaping process 150 are minimal and usually no post-peel cleaning is required. Removal of the adhesive layer with the detaping process creates very little stress to the thinned wafer and is compatible with low-k dielectrics.

Figure 1B:
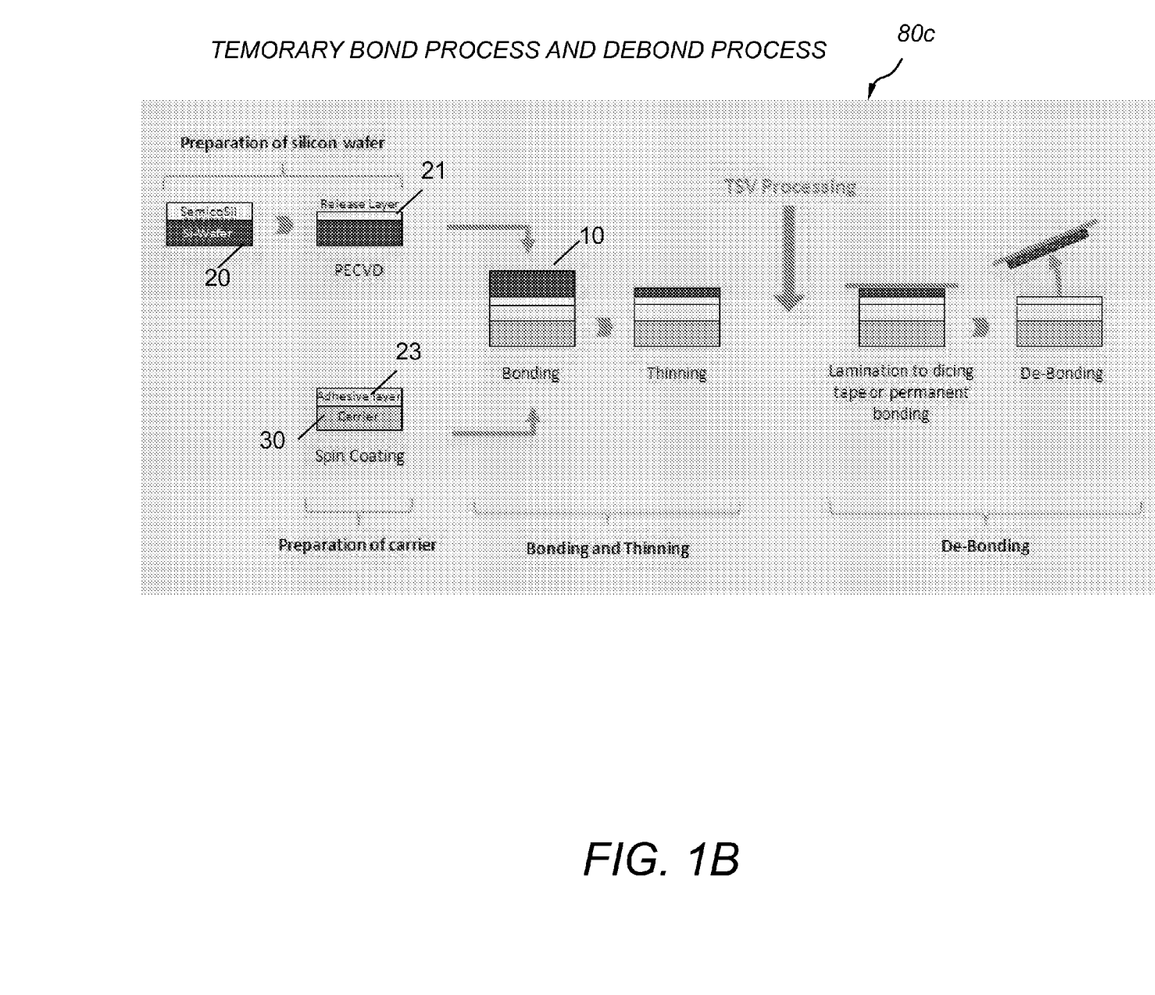
FIG. 1B is a schematic diagram of second example of a temporary wafer bonding process and a debonding process.

Referring to FIG. 1B, in another example, the temporary bonding process 80c includes the following steps. First, the device wafer 20 is coated with a very thin layer 21 of a precursor which subsequently is transformed to a "release layer" 21a via a plasma enhanced chemical vapor deposition process (PECVD). The total thickness of the finished "release layer" 21 is around 100 nm. Low plasma energy of about 10 Watts keeps the wafer at room temperature. By varying the plasma parameters the adhesion force of the release layer 21 can be modified. In the next step, the carrier wafer 30 is spin-coated with a thicker layer 23 of an elastomer in order to cover any topography of the device wafer. Layer thicknesses from about 60 µm up to 200 µm are possible within one coating step. The elastomer is a liquid, highly viscose material. The mechanical properties of the elastomer after bonding and curing allow the grinding wheel to back grind the elastomer outside the wafer rim as well. In the next step, the device wafer 20 is bonded to the carrier wafer 30 using the above described low force bonding process. Both samples are placed into the bond chamber 410 in a center-to-center aligned position with a separation from each other of about 10 mm. The device wafer 20 is coated with the very thin release layer 21 of about 100 nm thickness and the carrier wafer 30 is coated with the much thicker elastomer 23 (approximately 100 µm). The elastomer 23 at this point in time is still liquid, forming an edge bead of some 10 µm at the outer rim of the carrier wafer. After evacuating the bond chamber 410 the two wafers 20, 30 are brought into contact, the upper device wafer 20 first touching the elastomer 23 on the carrier wafer 30 on the top of the edge bead, thus sealing an inner chamber between both samples. By purging the bond chamber, both samples are pressed together just by the atmospheric pressure in the bond chamber 410, without any mechanical forces touching the wafer. Next, the bonded wafer stack 10 is thinned via CMP and then the thinned device wafer 20 is debonded from the carrier wafer 30. In this case, de-bonding is done in a purely mechanical way. The wafer stack 10 is mounted to a dicing tape which is held on a dicing frame with the thinned wafer side being adhered to the tape. Using a flat, porous plate the thinned wafer mounted onto the tape is sucked down by vacuum. This assembly keeps the sensitive thinned wafer in a fixed, flat and very stable position. By means of a slightly flexible, soft bendable vacuum chuck the carrier wafer 30 can be taken off by lifting it from one side, as shown in FIG. 1B.

As was mentioned above, one of the problems with these temporary bonding processes 80*a*, 80*c* is that the adhesive layer 23 is thick (in the range of 25 to 150 micrometers) and this causes high total thickness variations (TTV) in the device wafer surface planarity. A primary TTV influence comes from the post-join curing process. Actually, the thickness of the post-join adhesive layer correlates to the TTV error magnitude. Furthermore, a thick wet adhesive layer increases the risk of "squeezing-out" from the sides during the wafer joining step (84) in the uncured state. The present invention addresses these problems by applying a process that includes dual coating steps and dual curing steps.

Figure 6A:
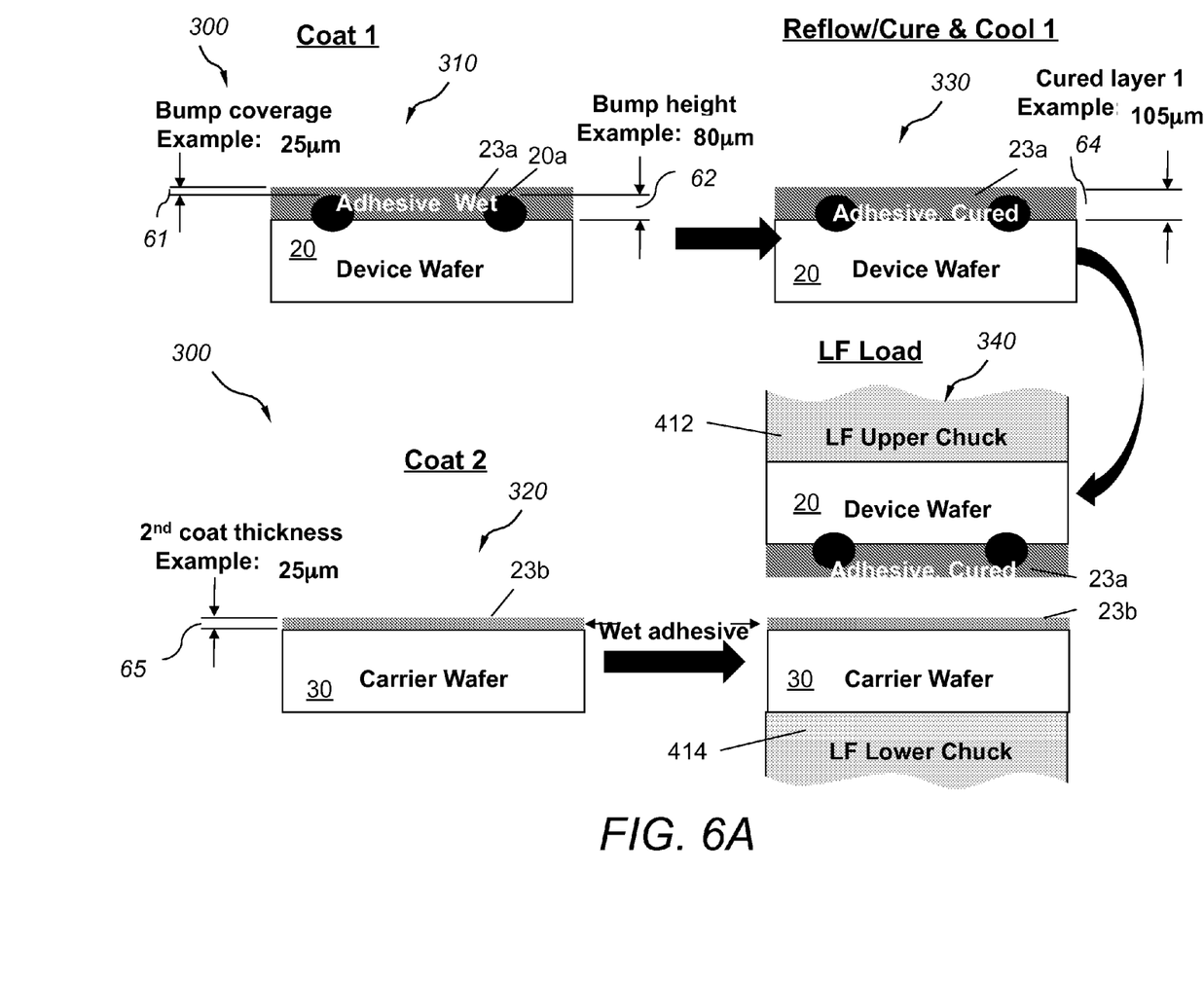
FIG. 6A and FIG. 6B are schematic diagrams of the dual coat and dual cure temporary bonding process, according to this invention.
Figure 6B:
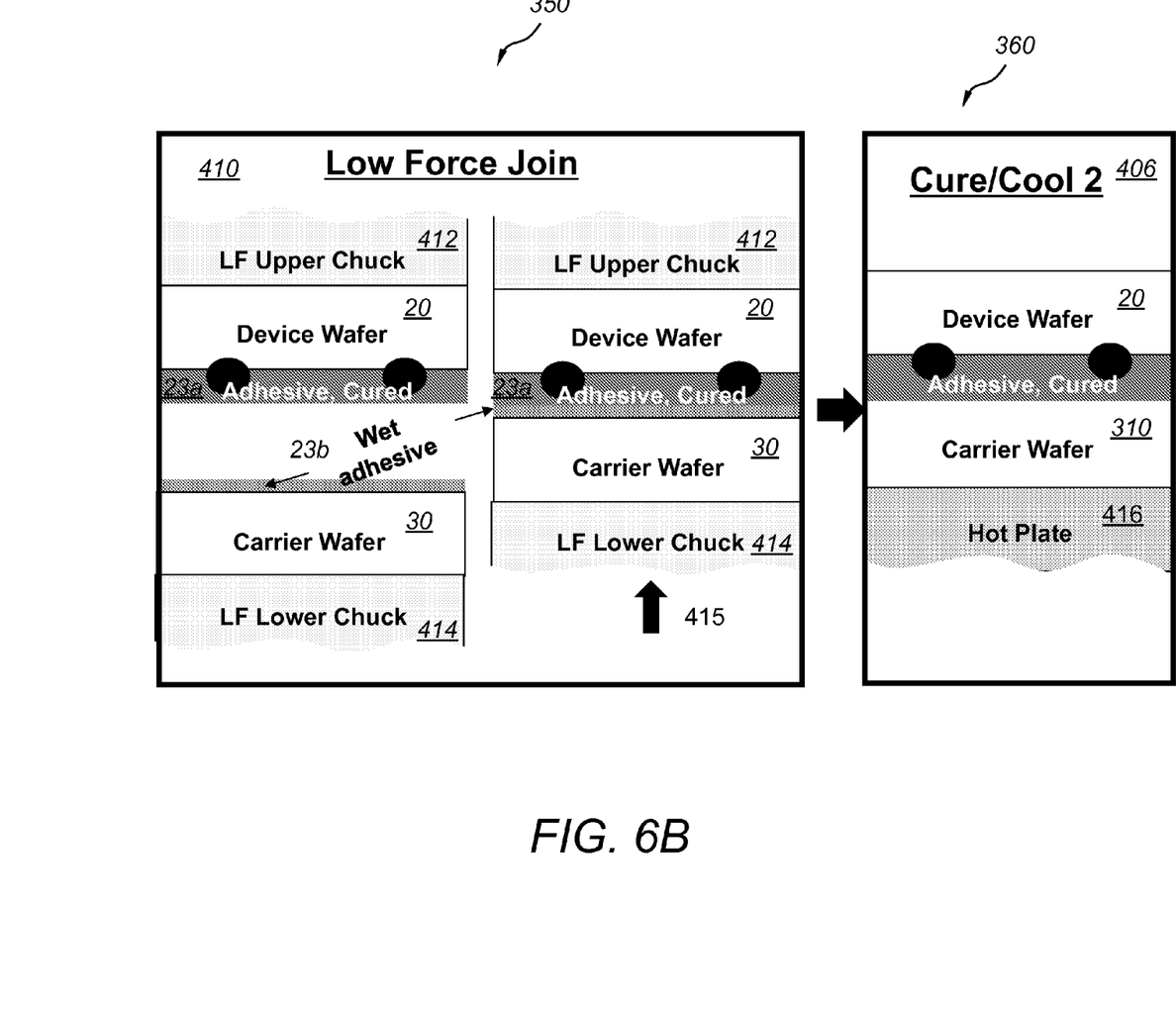

Referring to FIG. 6A, the dual coating/dual curing process 300 of this invention includes the following steps. In the first coating step 310, the device wafer 20 is spin coated with the wet adhesive layer 23*a* so that the solder bumps 20*a* are covered, as shown in FIG. 6A. The device wafer 20 may also include a release layer 21, as was described above. In one example, the solder bumps 20*a* have a height 62 of 80 micrometers and the adhesive layer 23*a* is deposited so that the thickness 61 of the adhesive layer above the solder bumps is about 25 micrometers. In the subsequent first curing step 330, the wet adhesive layer 23*a* on the device wafer 20 is cured, thereby resulting in a cured adhesive layer 23*a* having a total thickness 64 of 105 micrometers. In one example, the curing temperature is 120° C. and the curing time is 10 minutes for the first curing step 330. In the second coating step 320, the carrier wafer 30 is spin coated with a thin wet adhesive layer 23*b*. In one example, the thickness 65 of the wet adhesive layer 23*b* is 25 micrometers. The thickness of the wet adhesive layer 23*b* may be further decreased by changing the coating process parameters or the coating composition. In the next step 340, the device wafer 20 with the cured adhesive layer 23*a* is placed in the bonder 410 so that it is held by the top chuck 412 and the carrier wafer 30 with the wet adhesive layer 23*b* is placed on the bottom chuck 414, so that the wet adhesive layer 23*b* is opposite to the cured adhesive layer 23*a*, as shown in FIG. 6A and FIG. 6B. As was mentioned above, both the top 412 and bottom 414 chucks are low force chucks. The bonder chamber 410 is pumped down to a level of 10 mbar. Next, the lower chuck 414 moves up along direction 415 and the two adhesive layers 23*a* and 23*b* are brought into contact with each other in order to form a joined wafer stack 10 (350), as shown in FIG. 6B. The bonder chamber 410 is then vented and brought to atmospheric pressure and then the joined wafer stack 10 is removed. In the next step 360, the joined wafer stack 10 is placed in the curing chamber 406 (shown in FIG. 6B and FIG. 8) in order for the second cure step to take place. In this second cure step 360, a hot plate 416 is brought into contact with the backside of the carrier wafer 30 and the wet adhesive layer 23*b* is cured, thereby resulting in temporary bonding the carrier wafer 30 to the device wafer 20. In one example, the curing temperature for this second curing step is also 120° C. and the time is about 15 minutes. A final cure step (not shown) is also applied to ensure that all adhesive layers 23*a*, 23*b* are fully cured. The final curing temperature is 190° C. and the time is 10 minutes. In the next steps, the bonded wafer stack 10 is thinned via CMP and then the thinned device wafer 20 is debonded from the carrier wafer 30, as was described above.

Figure 7:
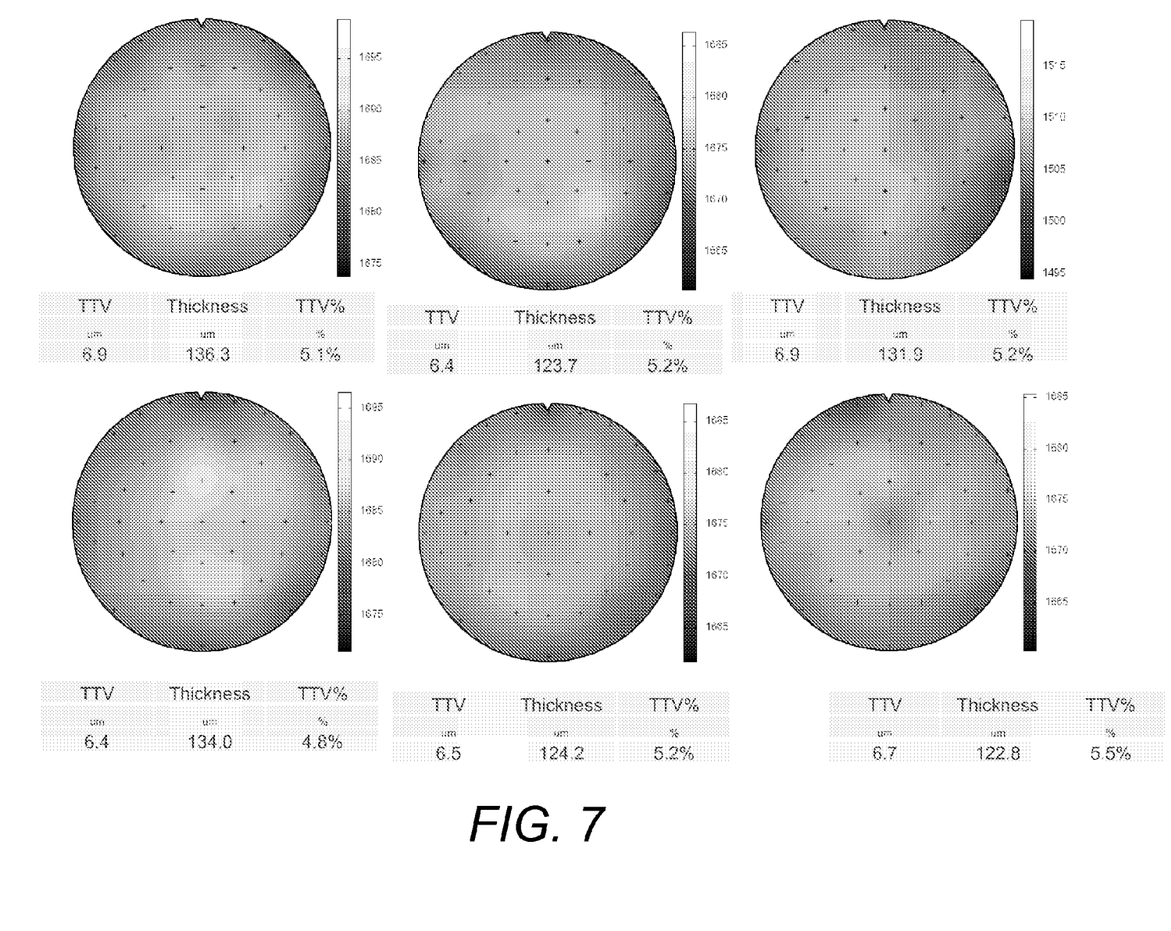
FIG. 7 depicts post bond TTV results achieved with the dual coat and dual cure temporary bonding process, according to this invention.

In one example the device wafer 20 has a thickness of 775 micrometers (without the solder bumps), the solder bumps have a height of 80 micrometers. The carrier wafer 30 is a blank silicon wafer having a thickness of 775 micrometers or a glass wafer with a thickness of 600 micrometers. The adhesive is a silicone elastomer TMAT 3.2 supplied by Thin Materials AG, Munich Germany. The temporary bonding equipment 410 is bonder XBS 300 supplied by Suss Microtec, Garching Germany. Surface metrology is provided by the integrated XBS 300 laser displacement thickness measurement or by a surface metrology instrument provided by Foothill Instruments for measuring coating uniformity on a blank wafer. FIG. 7 depicts typical post bond TTV results.

Figure 8:
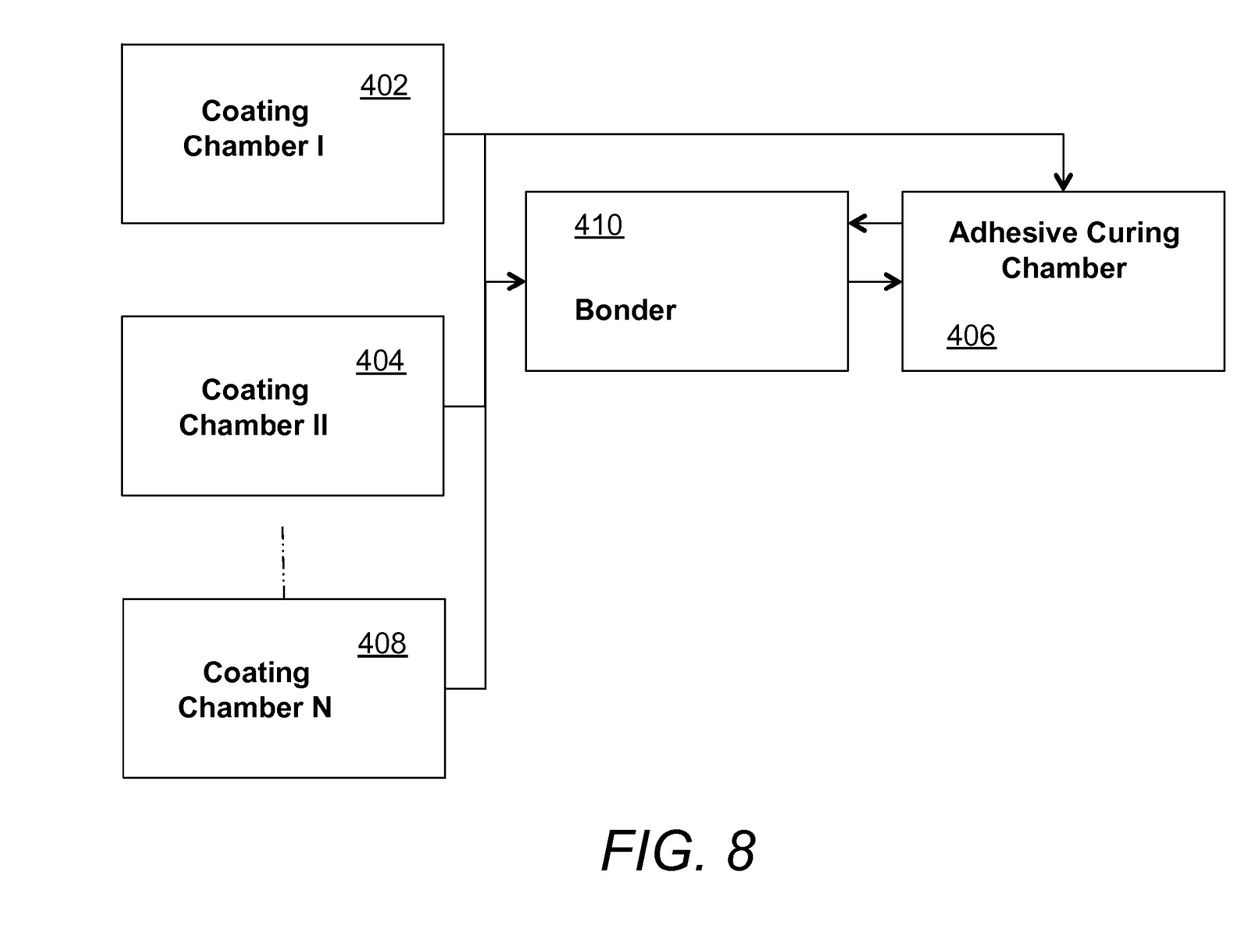
FIG. 8 is an overview block diagram of the dual coat and dual cure temporary bonder system according to this invention.

In other embodiments, wet adhesive layer 23*b* is applied to the cured adhesive layer 23*a* instead of to the carrier wafer 30. In all cases, no squeeze-out of the adhesive on any bonded wafer pair was observed. A plurality of coating modules 402, 404, 408 may be used in order to improve throughput of the process, as shown in FIG. 8.

Several embodiments of the present invention have been described. Nevertheless, it will be understood that various modifications may be made without departing from the spirit and scope of the invention. Accordingly, other embodiments are within the scope of the following claims.

The invention claimed is:

1. A method for temporary bonding two wafer surfaces comprising:
    providing a first wafer comprising first and second wafer surfaces opposite to each other;
    providing a second wafer comprising first and second wafer surfaces opposite to each other;
    applying a first adhesive layer upon said first surface of said first wafer;
    curing the first adhesive layer, thereby producing a cured first adhesive layer;
    applying a second adhesive layer upon said first surface of said second wafer;
    providing a bonder module comprising an upper chuck assembly and a lower chuck assembly arranged below and opposite the upper chuck assembly;
    inserting said first wafer into said bonder module and holding said first wafer by said upper chuck assembly so that its first surface with the cured first adhesive layer faces down;
    inserting said second wafer into said bonder module and placing said second wafer upon said lower chuck assembly so that said second adhesive layer faces up and is opposite to said first adhesive layer;
    moving said lower chuck assembly upwards and bringing said second adhesive layer in contact with said cured first adhesive layer; and
    curing said second adhesive layer, thereby forming a temporary bond between said first and second wafers.

2. The method of claim 1, wherein said second adhesive layer is cured by bringing a hot plate in contact with the second surface of the second wafer.

3. The method of claim 1 wherein said first and second adhesive layers are cured via at least one of Ultraviolet (UV), thermal, pressure, catalytic, chemical or time induced curing process.

4. The method of claim 1, wherein said first adhesive layer is applied upon said first surface of the first wafer via spin coating.

5. The method of claim 1, wherein said first adhesive layer comprises a silicone elastomer.

6. The method of claim 1, wherein said curing of the first and second adhesive layers occurs at a curing temperature in the range of 80° C. to 160° C. and a curing time in the range of 1-15 minutes.

7. The method of claim 1, wherein the upper and lower chuck assemblies comprise low force upper and lower chucks, respectively, and wherein the second adhesive layer is brought in contact with said cured first adhesive layer by first evacuating the bonder module and then bringing the bonder module to atmospheric pressure via purging.

8. The method of claim 1, further comprising curing said temporary bonded first and second wafers.

9. The method of claim 8, wherein said curing of said temporary bonded first and second wafers occurs at a curing temperature in the range of 120 ° C. to 220° C. and a curing time in the range of 1-15 minutes.

10. The method of claim 1, further comprising thinning the second surface of the first wafer and then debonding the thinned first wafer from the second wafer.

11. The method of claim 1, wherein said first adhesive layer comprises a thickness of less than 110 micrometers and wherein said second adhesive layer comprises a thickness of less than 30 micrometers.

12. A method for temporary bonding two wafer surfaces comprising:
providing a first wafer comprising first and second wafer surfaces opposite to each other;
providing a second wafer comprising first and second wafer surfaces opposite to each other;
applying a first adhesive layer upon said first surface of said first wafer;
curing the first adhesive layer, thereby producing a cured first adhesive layer;
applying a second adhesive layer upon said cured first adhesive layer;
providing a bonder module comprising an upper chuck assembly and a lower chuck assembly arranged below and opposite the upper chuck assembly;
inserting said first wafer into said bonder module and holding said first wafer by said upper chuck assembly so that its first surface with the cured first adhesive layer and said second adhesive layer faces down;
inserting said second wafer into said bonder module and placing said second wafer upon said lower chuck assembly so that said first surface of the second wafer faces up and is opposite to said second adhesive layer;
moving said lower chuck assembly upwards and bringing said first surface of the second wafer in contact with said second adhesive layer; and
curing said second adhesive layer, thereby forming a temporary bond between said first and second wafers.

13. A method for temporary bonding two wafer surfaces comprising:
providing a first wafer comprising first and second wafer surfaces opposite to each other;
providing a second wafer comprising first and second wafer surfaces opposite to each other;
applying a first adhesive layer upon said first surface of said first wafer;
curing the first adhesive layer, thereby producing a cured first adhesive layer;
applying a second adhesive layer upon said first surface of said second wafer;
providing a bonder module comprising an upper chuck assembly and a lower chuck assembly arranged below and opposite the upper chuck assembly;
inserting said first wafer into said bonder module and placing said first wafer upon said lower chuck assembly so that its first surface with the cured first adhesive layer faces up;
inserting said second wafer into said bonder module and holding said second wafer by said upper chuck assembly so that said second adhesive layer faces down and is opposite to said first adhesive layer;
moving said lower chuck assembly upwards and bringing said first adhesive layer in contact with said second adhesive layer; and
curing said second adhesive layer, thereby forming a temporary bond between said first and second wafers.

14. A method for temporary bonding two wafer surfaces comprising:
providing a first wafer comprising first and second wafer surfaces opposite to each other;
providing a second wafer comprising first and second wafer surfaces opposite to each other;
applying a first adhesive layer upon said first surface of said first wafer;
curing the first adhesive layer, thereby producing a cured first adhesive layer;
applying a second adhesive layer upon said first surface of said second wafer;
bringing said second adhesive layer in contact with said cured first adhesive layer; and
curing said second adhesive layer, thereby forming a temporary bond between said first and second wafers.

15. The method of claim 14, further comprising:
providing a bonder module comprising an upper chuck assembly and a lower chuck assembly arranged below and opposite the upper chuck assembly;
inserting said first wafer into said bonder module and holding said first wafer by said upper chuck assembly so that its first surface with the cured first adhesive layer faces down;
inserting said second wafer into said bonder module and placing said second wafer upon said lower chuck assembly so that said second adhesive layer faces up and is opposite to said first adhesive layer; and
moving said lower chuck assembly upwards for bringing said second adhesive layer in contact with said cured first adhesive layer.

* * * * *